United States Patent [19]

Murata et al.

[11] Patent Number: 5,399,912
[45] Date of Patent: Mar. 21, 1995

[54] HOLD-TYPE LATCH CIRCUIT WITH INCREASED MARGIN IN THE FEEDBACK TIMING AND A MEMORY DEVICE USING SAME FOR HOLDING PARITY CHECK ERROR

[75] Inventors: Shigeharu Murata, Ohme; Takasi Oomori, Hatano; Masami Usami, Ohme; Masato Iwabuchi, Hachiohji, all of Japan

[73] Assignee: Hitachi, Ltd., Tokyo, Japan

[21] Appl. No.: 728

[22] Filed: Jan. 5, 1993

[30] Foreign Application Priority Data

Jan. 13, 1992 [JP] Japan .................. 4-023275
Oct. 30, 1992 [JP] Japan .................. 4-316069

[51] Int. Cl.[6] .......................................... H03K 17/56
[52] U.S. Cl. ........................................ 327/94; 327/204
[58] Field of Search ...................... 365/189.05, 201; 307/247.1, 289, 291, 353

[56] References Cited

U.S. PATENT DOCUMENTS

| | | | |
|---|---|---|---|
| 4,758,739 | 7/1988 | Ovens et al. | 307/289 |
| 4,777,586 | 10/1988 | Matsubara et al. | 364/200 |
| 4,905,142 | 2/1990 | Matsubara et al. | 364/200 |

*Primary Examiner*—William L. Sikes
*Assistant Examiner*—James A. Dudek
*Attorney, Agent, or Firm*—Antonelli, Terry, Stout & Kraus

[57] ABSTRACT

A hold-type latch circuit which features an increased operation margin. A feedback circuit feeds the data output logic state of a non-inversion data output terminal of the latch circuit back to a data input terminal thereof, to increase a margin in the setup time $t_s$ and holding time $t_h$ in controlling the data holding capability of the latch circuit, thereby to increase the margin of thereof.

20 Claims, 9 Drawing Sheets

HOLD-TYPE LATCH CIRCUIT WITH INCREASED MARGIN IN THE FEEDBACK TIMING AND A MEMORY DEVICE USING SAME FOR HOLDING PARITY CHECK ERROR

BACKGROUND OF THE INVENTION

The present invention relates to a circuit technology for latching input data, and more specifically to a hold-type latch circuit having a control function which holds the output logic state under a predetermined condition, such as technology that can be effectively adapted to a bipolar logic LSI (large-scale semiconductor integrated circuit device).

There has been known a flip-flop circuit or a latch circuit as a logic circuit which has two stable output states which are dependent on the input logic state and which holds the previous state depending on the input logic state. A latch circuit can be formed by adding a logic gate to the input stage of an RST flip-flop that has a reset input terminal, a set input terminal and a clock input terminal. The operation of the latch circuit resembles that of the D-type flip-flop, in which a change in the data input under the condition where a clock input is assuming a high level is transmitted to the output terminal thereof. The logic state of the output cannot change when the clock input is fixed to a low level. By utilizing such a holding function, the state of signal is held under a predetermined condition, and the state thus held is transmitted to a control circuit or the like circuit at predetermined intervals.

As an example of a literature which describes the latch circuit, there can be cited "A Pocket Book on Electronic Engineering" (P. 8-46~P. 8-53) published by ohm Co., 1980.

SUMMARY OF THE INVENTION

In FIG. 9 there is shown a construction of a schemed latch circuit that is capable of holding the state of signal under a predetermined condition as described above. The latch circuit shown in FIG. 9 was studied by the present inventors in connection with their attempts at achieving the present invention and therefore, does not pertain to the prior art.

The latch circuit shown in FIG. 9 comprises a slave/-master latch circuit 4 that transmits data D input to a data input terminal 51 to data output terminals 53 and 54 depending upon a clock signal CLK* (a mark * indicates low active or logic inversion), and an AND gate 55 which produces the logical product of an inverted output Q* from the inversion output terminal 54 of the slave/master latch circuit 4 and a clock signal CLK*. The output of the AND gate 55 is transmitted to the clock input terminal 52 to hold the output data.

FIG. 10 shows the operation timings of the above latch circuit.

The input data D is transmitted to the output terminals 53 and 54 in synchronism with the falling edge of the clock signal CLK*. When the output Q* of the inversion terminal 54 is asserted to the low level, the output Aot of the AND gate 55 is fixed to the low level irrespective of the logic state of the clock signal CLK*. When the output Aot of the AND gate 55 is fixed to the low level as described above, the logic state at the clock input terminal 52 of the slave/master latch circuit 4 never assumes the high level, and whereby the output logic of the slave/master latch circuit 4 is held irrespective of a subsequent change in the state of the input data D.

Here, the inverted output data Q* of the slave/master latch circuit 4 is fed back after a predetermined delay time so as to maintain a predetermined setup time ts and a holding time th with respect to the clock signal CLK*. The setup time ts is determined by the rising edge of the clock signal CLK* and the holding time th is determined by the falling edge of the clock signal CLK*. When the timing for asseting the inverted output Q* that is fed back is not appropriate, it is not possible to maintain the setup time ts and the holding time th, and there develop such inconveniences as reduction in the pulse width and generation of noise. For example, when the setup time ts is shorter than 0 (ts<0), the pulse width of the output Aot of AND gate 55 decreases and when the holding time th is shorter than 0 (th<0), noise develops in the output Aot of AND gate 55. The setup time ts and the holding time th decrease with a decrease in a cycle time Tc of the clock signals CLK*, whereby it becomes difficult to feed back the inverted output data Q* with regard to maintaining precision. It was therefore discovered by the present inventors that when the latch circuit shown in FIG. 9 is utilized for a semiconductor integrated circuit device that is controlled by clock signals, it is difficult to increase the operation speed of the semi conductor integrated circuit, despite the reduction in the cycle time Tc of the clock signals CLK*, to the lack of margin in the feedback timing.

The above-mentioned hold-type slave/master latch circuit can be used in a semiconductor integrated circuit. In a static RAM (random access memory) that includes static memory cells, for instance, the memory cell data are often checked for their parity, and the above-mentioned hold-type slave/master latch circuit is used for temporarily holding the results of parity checking. It was, however, discovered by the present inventors that in a static RAM and, in particular, in a bipolar static RAM to which bipolar transistors are applied by giving importance to high-speed operation, it is not allowed to sufficiently shorten the cycle time Tc of the clock signals CLK* due to the lack of margin in the feedback timing of the hold-type slave/master latch circuit that temporarily holds the result of parity checking, which is a principal cause at hindering efforts for increasing the operation speed of the static RAM.

It is an object of the present invention to provide a hold-type latch circuit which is designed to increase the margin in the feedback timing.

Another object of the present invention is to provide a semiconductor memory device that includes such a hold-type latch circuit.

The above and other objects as well as novel features of the present invention will become obvious from the description of the specification and the accompanying drawings.

Among the disclosed aspects in this application, a representative example briefly is described below.

That is, the hold-type latch circuit comprises a data input terminal for receiving input data and a data output terminal for outputting data; a latch circuit to transmit the data from the data input terminal to the data output terminal depending on a clock signal; and a control circuit which controls holding of the data output logic state of the latch circuit, wherein the control circuit is formed by a feedback circuit that feeds the data output logic state from the data output terminal back to the data input terminal. Here, the feedback circuit may include an OR gate that produces the logical sum of the input data from an external unit and the non-inverted output data of the latch circuit. Moreover, the hold-type latch circuit can be used as a holding means in a semiconductor memory device that comprises a parity-checking circuit which checks parity in the data read out from the memory cells, and the holding means that holds the result of parity checking.

When the logic state of data output from the data output terminals is held by the operation of the feedback circuit as mentioned above, the setup time ts and the holding time th are determined by the falling edge of a clock signal, which makes it possible to increase the margin in the feedback timing.

DESCRIPTION OF THE PREFERRED EMBODIMENTS

Figure 3:
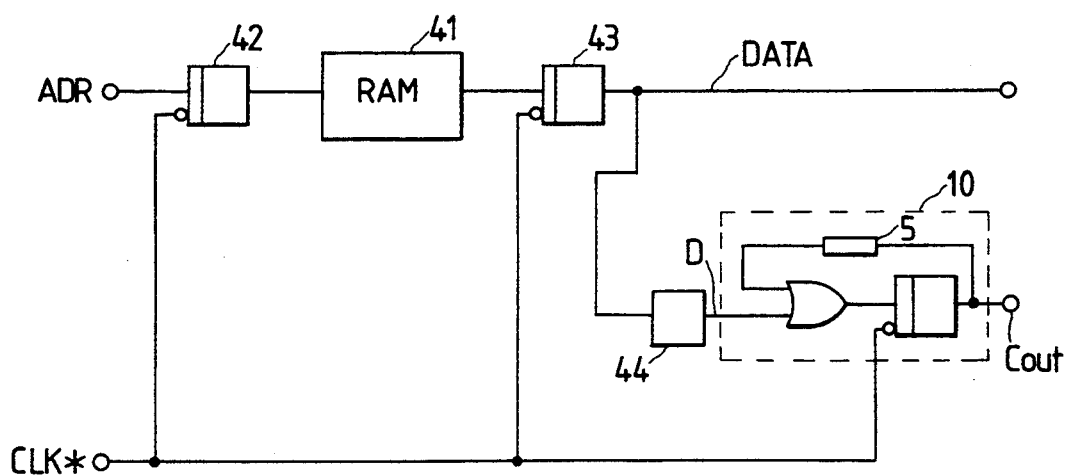
FIG. 3 is a block diagram illustrating the whole constitution of a static RAM that includes the above slave/master latch circuit.

FIG. 3 shows a static RAM (random access memory) according to an embodiment of the present invention.

Although it is not particularly limited thereto, a static RAM is shown in FIG. 3 which is formed in a semiconductor substrate such as a single crystalline silicon substrate by the well known technology for fabricating semiconductor integrated circuits.

In FIG. 3, reference numeral 41 denotes a RAM that includes a memory cell array in which a plurality of static memory cells formed by bipolar transistors are arranged in the form of a matrix, and peripheral circuits such as decoders that form signals for addressing the memory cells and control circuits that form various timing signals. Reference numeral 42 denotes an address latch circuit which latches an address signal ADR input from an external unit at an assert timing of a clock signal CLK*. The address signal ADR that is latched is input to the RAM 41 of a subsequent stage, and stored data according to the input address signal are read out from the RAM 41. The data read out from the RAM 41 is latched by a data out latch circuit 43 in a subsequent stage at the assert timing of the clock signal CLK*, and is transmitted to a parity-checking circuit 44 and a circuit in a subsequent stage such as a central processing unit CPU that is not shown. The parity-checking circuit 44 checks parity of the data latched by the data out latch circuit 43, and the checked result is transmitted to a hold-type slave/master latch circuit 10 in a subsequent stage. When it is so determined that the data read out from the RAM 41 is erroneous as a result of checking by the parity-checking circuit 44, the output of the parity-checking circuit 44 is asserted to the high level and is held by the hold-type slave/master latch circuit 10 in synchronism with the clock signal CLK*. The data (Cout) that is held is transmitted to the circuit (CPU) in the subsequent stage that is not shown and is used for the control operation such as re-transfer of data.

Figure 1:
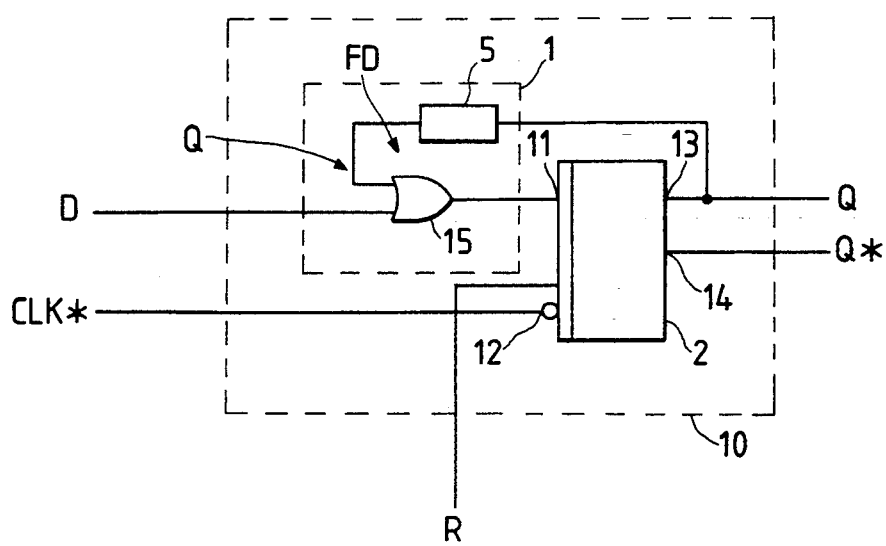
FIG. 1 is a diagram of electric connection of a hold-type slave/master latch circuit according to an embodiment of the present invention.
Figure 2:
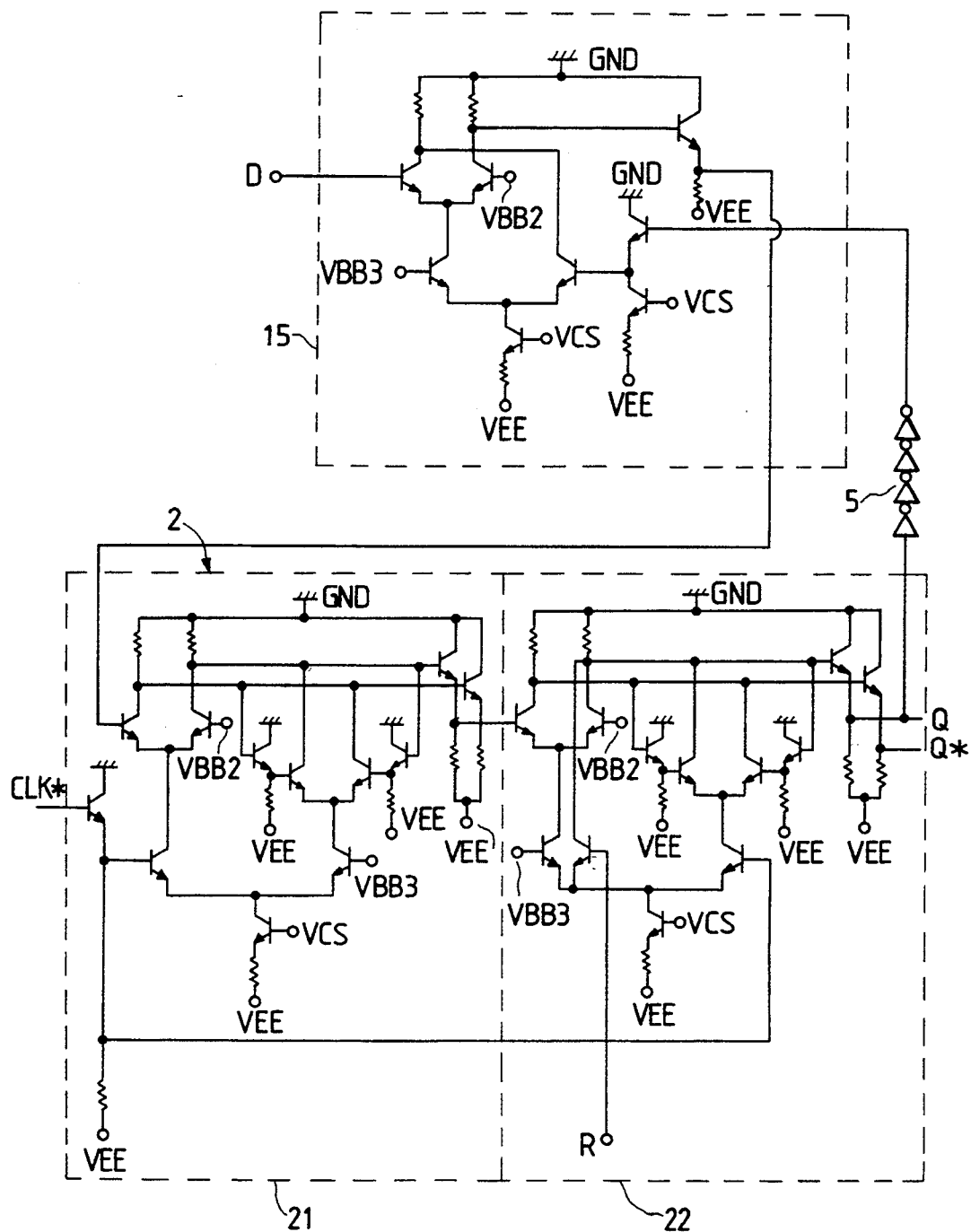
FIG. 2 is a diagram of an equivalent circuit of the holding-type slave/master latch circuit.

FIG. 1 shows the constitution of the above-mentioned hold-type slave/master latch circuit 10, and FIG. 2 shows an equivalent circuit thereof.

As shown in FIG. 1, the hold-type slave/master latch circuit 10 comprises a latch circuit 2 having a data input terminal 11 for receiving data from the parity-checking circuit 44 and data output terminals 13 and 14 to transmit the data from the data input terminal to the data output terminals 13 and 14 depending on a clock signal CLK*; and a control circuit 1 which holds the data output logic state of the latch circuit 2. The control circuit 1 works as a feedback circuit FD that feeds the data output logic state from the data output terminal 13 back to the data input terminal 11. Although it is not particularly limited thereto, the feedback circuit FD includes an OR gate 15 which produces the logical sum of an input data D from an external unit and the output data of the latch circuit 2, connects the non-inverted output terminal 13 of the latch circuit 2 to an input terminal of the OR gate 15 via a delay circuit 5, and transmits the output of logical sum of the OR gate 15 to the data input terminal 11 of the latch circuit 2. When the data D from the parity-checking circuit 44 has the high level, the data Q of the latch circuit 2 is fed back to the data input terminal 11, so that the logic state at this moment is held. That is, the input data D is transmitted to the data output terminals 13 and 14 in synchronism with the assert timing of the clock signal CLK*o When the logic state at the non-inversion output terminal 13 has the high level, furthermore, this logic state is fed back to the data input terminal via the delay circuit 5 and OR gate 15; i.e., the logic state at the non-inversion output terminal 13 of the latch circuit 2 is held at the high level. The thus held state is released when a reset signal R is asserted to the high level by the circuit (CPU) in the subsequent stage that is not shown and when the output Q of the latch circuit 2 assumes the low level.

As shown in FIG. 2, the latch circuit 2 includes a combination of a slave circuit 21 and a master circuit 22. Though it is not particularly limited thereto, the slave circuit 21 and the master circuit 22 are constituted by ECL (emitter-coupled logic) circuits in which npn-type bipolar transistors and resistors are coupled together. The ECL is constituted by utilizing a current switching circuit in which bipolar transistors are differentially connected and are operated in an active region (unsaturated region) to accomplish a high-speed response. The output of the OR gate 15 and the clock signal CLK* are input to an initial-stage input ECL circuit in the slave circuit 21, and the output of the slave circuit 21 is input to an initial-stage input ECL circuit in the master circuit 22. Ground GND is a power source (ground potential) of a high potential side, and VEE is a power source (negative power source) of a low potential side. Bias voltages VBB2, VBB3 and VCS are applied to the base electrodes of the bipolar transistors. Though it is not particularly limited thereto, the delay circuit 5 for delaying the output Q of the latch circuit 2 is constituted by a plurality of inverters which are connected in series with each other, and the signal delay time can be adjusted depending upon the number of stages of the inverters that are connected in series. That is, the delay time increases with an increase in the number of stages of the inverters connected in series, i.e. cascade-connected. Each of the inverters can be constituted by an ECL circuit.

Figure 4:
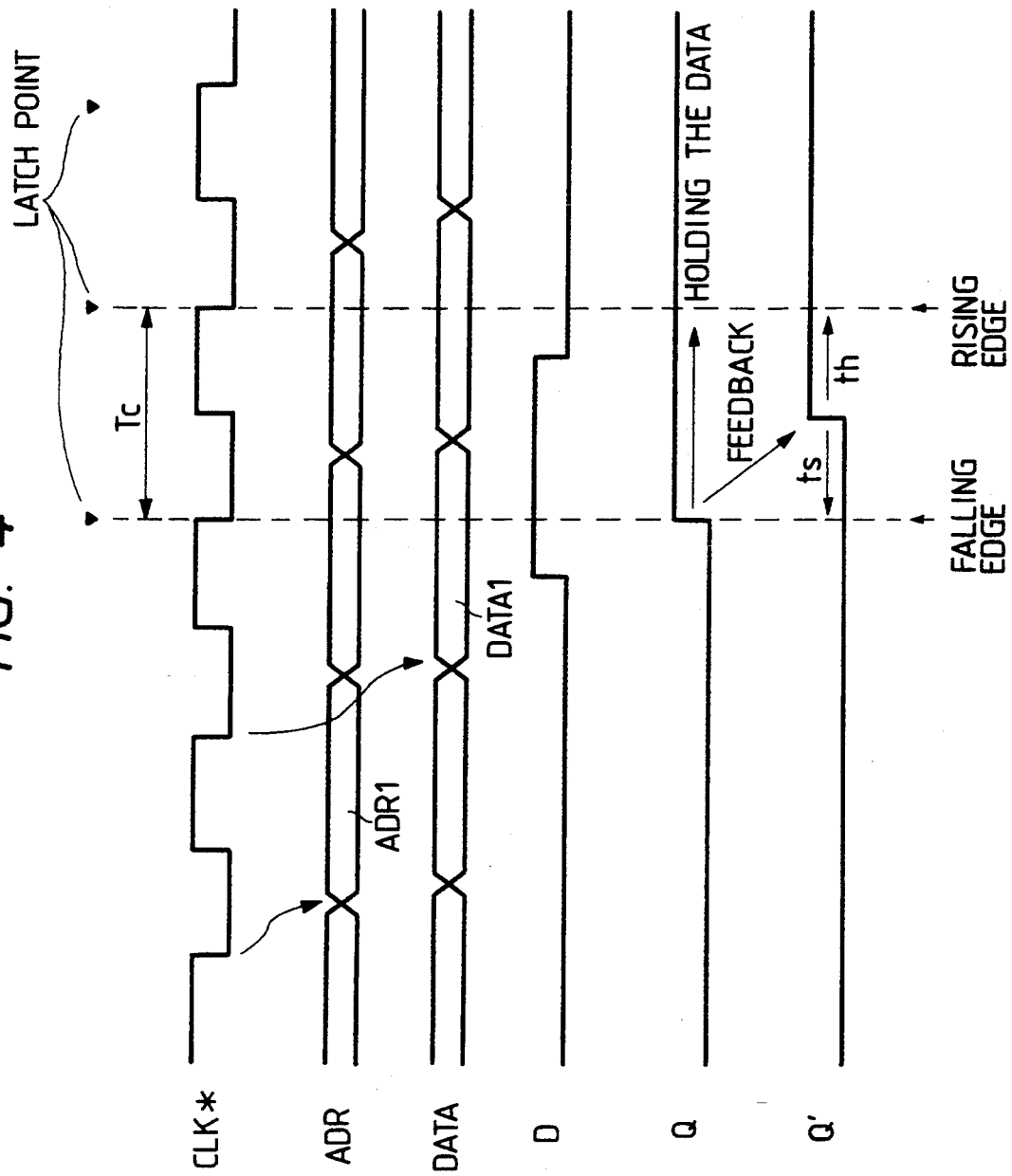
FIG. 4 is a diagram of operation timings of major portions in the static RAM.

FIG. 4 shows the operation timings of the static RAM according to this embodiment.

An address ADR is latched by the address latch circuit 42 in synchronism with the falling timing of the waveform of clock signal CLK*, and the data corresponding to the address is read out from the static RAM 41. The data that is read out is latched by the data out latch (or data output latch) circuit 43 in the subsequent stage in synchronism with the next falling timing of the clock signal CLK*, and is output to an external unit via a buffer circuit or the like circuit. The output of the static RAM 41 contains a parity bit which enables the parity of the output data to be checked. For instance, the output data of the RAM 41 consists of 9 bits in which one bit is a parity bit. When the parity of the output data is made an even number, the value of the parity bit is so determined that the number of data of "1" will be an even number in the data of 9 bits output from the RAM 41. For instance, when the data of 8 bits is 11000010, the parity bit is 1. The parity-checking circuit 44 obtains an exclusive logical sum of output data DATA of the data out latch circuit 43, thereby to check parity of the output data. That is, the output data DATA is checked in regard to whether its parity is an even number or not. When the parity of data that is read out is normal, the output logic of the parity-checking circuit 44 is of the low level. However, when the parity of data that is read out is abnormal, the output logic of the parity-checking circuit 44 becomes the high level, and this high-level state is held by the hold-type slave/master latch circuit 10. Then, the output Cout of the hold-type slave/master latch circuit 10 is fixed to the high-level state, and abnormality in the data that is read out is transmitted to a unit outside the static RAM.

Here, the hold-type slave/master latch circuit 10 operates as described below.

The data D is latched by the latch circuit 2 at the falling edge of the waveform of a clock signal CLK*. The input data D becomes the low level at the falling edge of the waveform of a next clock signal CLK*. Here, however, since the above data D of the high level is fed back to the data input terminal 11 via the OR gate 15, the logic state of output at the non-inversion output terminal 13 is maintained at the high level. In this embodiment, the setup time ts and the holding time th of output data Q of the non-inversion output terminal 13 and the clock signal CLK* are determined by the falling edge of the waveform of the clock signal CLK*. As a result, a margin in the feedback timing increases compared with that of the circuit shown in FIG. 9. When the cycle time Tc of the clock signal CLK* is 4 ns (nanoseconds), for instance, the data according to the circuit shown in FIG. 9 must be fed back within a period of Tc/2=2 ns as is obvious from the timing diagram of FIG. 10. Therefore, both the setup time ts and the holding time th have a margin of 1 ns. According to this embodiment in which the setup time ts and holding time th of the output signal Q' of the delay circuit 5 are determined by the falling edge of a clock signal CLK*, on the other hand, the data may be fed back within a period of Tc=4 ns. Therefore, both the setup time ts and the holding time th have a margin of 2 ns. Thus, the hold-type slave/master latch circuit 10 of this embodiment has a margin of feedback timing which is twice as great as that of the circuit of FIG. 9.

Figure 9:
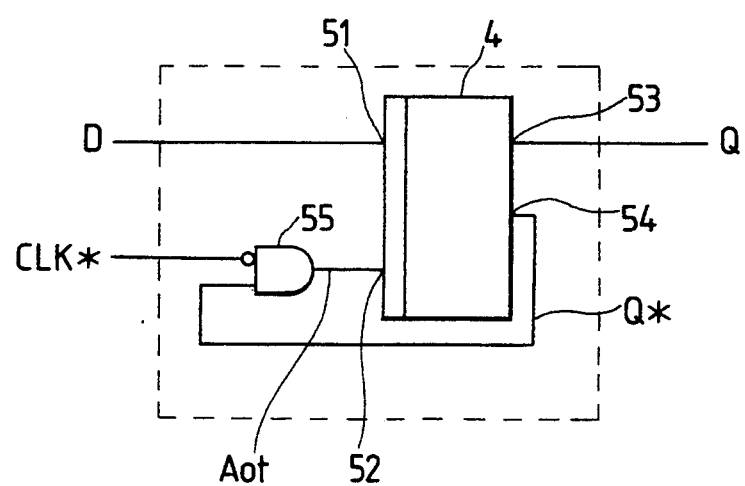
FIG. 9 is a diagram of electric connection of a hold-type latch circuit.
Figure 10:
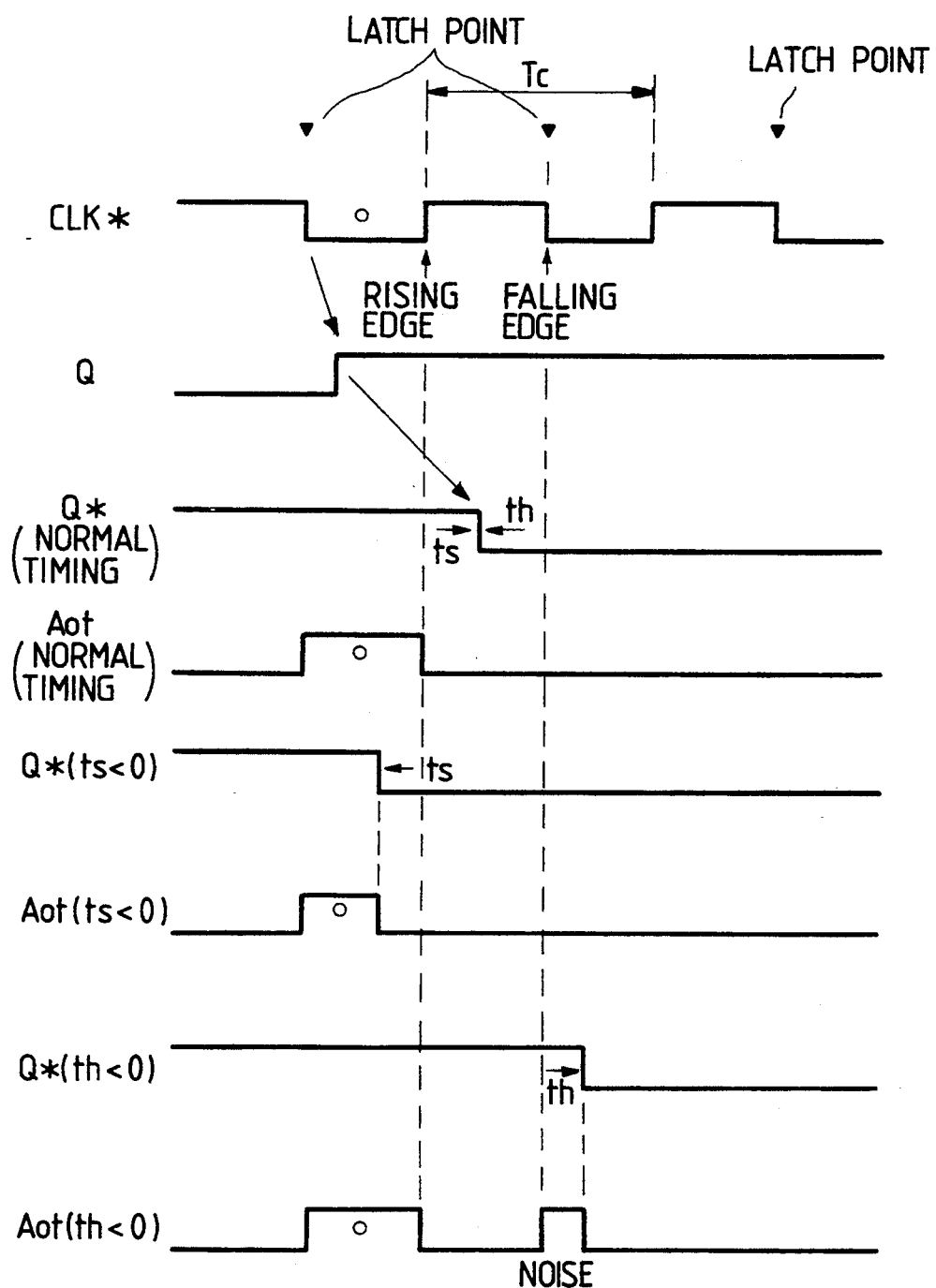
FIG. 10 is a diagram of operation timings of the hold-type latch circuit shown in FIG. 9.

When the circuit of FIG. 9 is adapted to a static RAM that employs bipolar transistors by giving importance to high-speed operation, in particular, it becomes difficult to sufficiently shorten the cycle time Tc of the clock signal CLK* due to the lack of timing margin of the hold-type slave/master latch circuit that temporarily holds the result of parity checking. In the case of the embodiment however, in which the timing margin of feedback is doubled as described above, the cycle time Tc of the clock signal CLK* can be shortened correspondingly, making it possible to increase the operation speed of the static RAM.

The following functions and effects can be obtained from the above-mentioned embodiment.

(1) When the data is held by feeding the logic state of data output from the data output terminal 13 back to the data input terminal 11 through the feedback circuit FD, the setup time ts and the holding time th are determined from the falling edge of the clock signal CLK* and the margin of feedback timing is doubled compared with that of the circuit of FIG. 9.

(2) The feedback circuit FD can be easily constituted by including the OR gate 15 which obtains a logical sum of the input data D and the output data of the latch circuit 2, and by coupling the output terminal of the OR gate 15 to the data input terminal 11 of the latch circuit 2.

(3) Owing to the functions and effects mentioned in (1) above, it is allowed to shorten the cycle time Tc of the clock signal CLK* of the static RAM that includes the hold-type slave/master latch circuit 11 and, hence, to increase the operation speed of the RAM.

Figure 5:
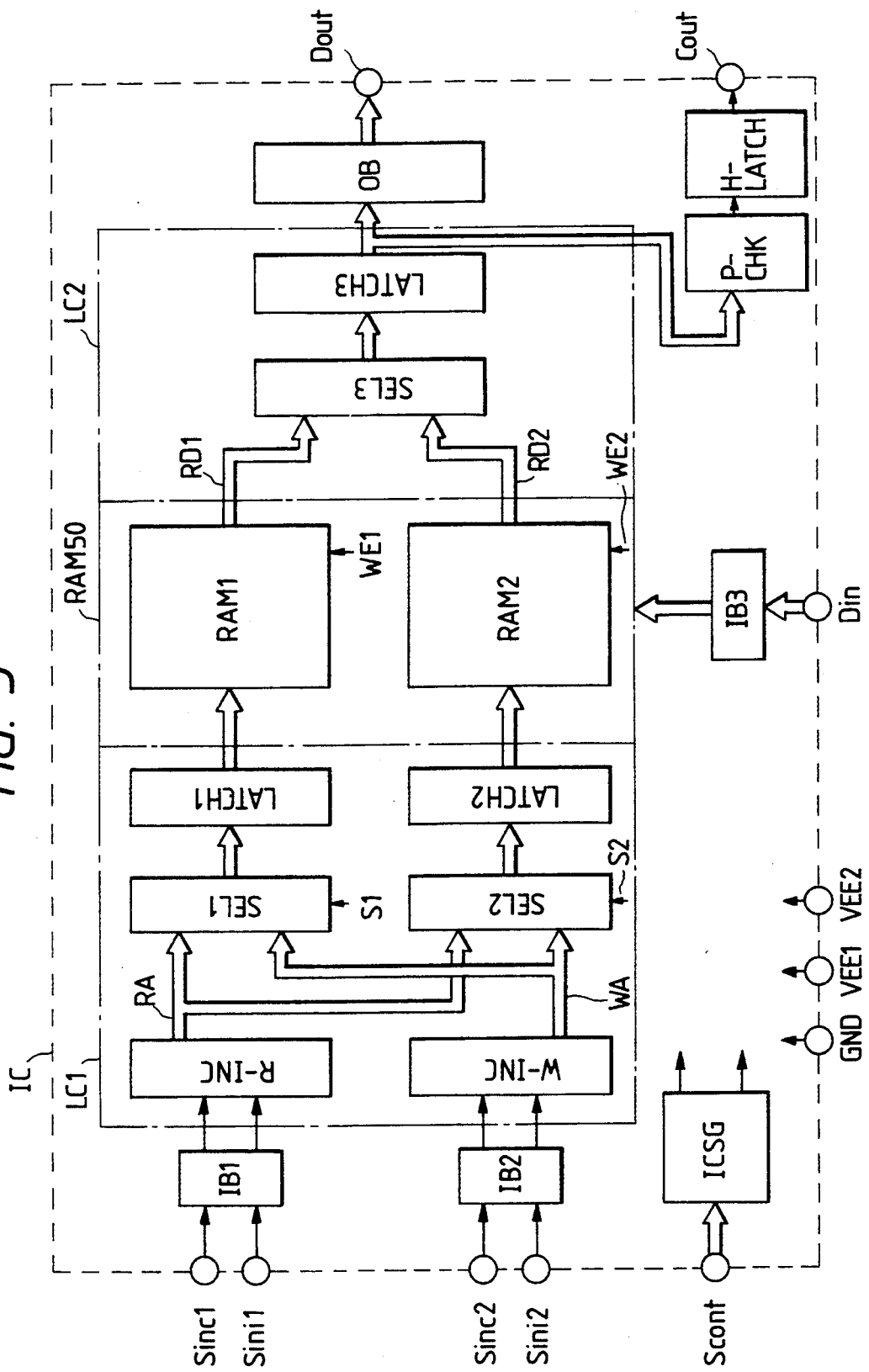
FIG. 5 is a block diagram illustrating the whole constitution of the static RAM according to another embodiment.

FIG. 5 illustrates a semiconductor integrated circuit device that includes a static RAM according to another embodiment of the present invention.

Though it is not particularly limited thereto, a static RAM is shown in FIG. 5 which is formed in a semiconductor substrate such as a single-crystal silicon substrate by the well known technology for fabricating semiconductor integrated circuits.

The semiconductor integrated circuit device IC shown in FIG. 5 includes a static RAM 50, a logic circuit LC1 provided in a stage preceding the RAM 50, and a logic unit LC2 provided in a stage succeeding the RAM 50. The RAM 50 includes a RAM 1 and a RAM 2 which have the same constitution. The read operation is carried out by one RAM in parallel with the write operation by the other RAM. Such functions are suited for a cache memory which must carry out the read operation and the write operation at high speeds.

The logic circuit LC1 is provided to feed a read address and a write address to the RAM 50 in response to a read address increment signal Sinc1 and a write address increment signal Sinc2 that are fed to external terminals. The read address increment signal Sinc1 and the write address increment signal Sinc2 are latched by input buffers IB1 and IB2, and a read address increment circuit R-INC and a write address increment circuit W-INC are controlled for their operations by the output signals of the input buffers IB1 and IB2. For instance, the address signal increment circuit R-INC successively updates the read address signal RA and outputs it in response to the increment signal Sinc1 of the high level, and stops updating the read address signal RA in response to the increment signal Sinc1 of the low level. Moreover, a read address initialize signal Sini1 and a write initialize signal Sini2 are fed through the external terminals in order to initialize the read address signal RA and the write address signal WA to the initial values. Selection circuits SEL1 and SEL2 are provided for the RAM1 and RAM2 in order to selectively feed the read address signal RA or the write address signal WA to the RAM. When the read address signal RA is selected by the selection circuit SEL1, the write address signal WA is selected by the selection circuit SEL2. The selection circuits SEL1 and SEL2 are controlled by the internal control signals S1 and S2. The selected address signals are fed to the RAM1 and RAM2 simultaneously via latch circuits LATCH1 and LATCH2.

The logic circuit LC2 includes a selector SEL3 which selectively feeds a read data RD1 or RD2 read out from RAM1 or RAM2 to an output latch circuit LATCH3. The read data RD1 or RD2 is sent to an external unit as an output data Dout via an output buffer OB.

The write data Din for RAM1 or RAM2 is transmitted to RAM1 and RAM2 via the input buffer IB3. The write operations for the RAM1 and RAM2 are selectively controlled by the write enable signal WE1 and WE2. Though there is no particular limitation, the control signals S1, S2, WE1 and WE2 are formed by an internal control signal generating circuit ICSG that receives a control signal Scont. The static RAM is served with power source voltages VEE1 and VEE2 of different levels in order to supply suitable power source voltage depending upon the circuit constitution and to reduce the consumption of electric power.

In a stage subsequent to the output latch circuit LATCH3 is disposed a parity-checking circuit P-CHK that checks the parity of data read from the memory cells, and in a stage further subsequent thereto is disposed a hold-type slave/master latch circuit H-LATCH which holds the result of parity checking. Though it is not particularly limited thereto, the output logic of the parity-checking circuit 44 assumes the low level when the data that is read out is normal. When the data that is read out is abnormal, however, the output logic of the parity-checking circuit 44 assumes the high level, and this high-level state is held by the hold-type slave/master latch circuit H-LATCH in the subsequent stage. Then, the output Cout of the hold-type slave/master latch circuit H-LATCH is fixed to the state of high level, and abnormality in the data that is read out is transmitted to a unit on the outside of the semiconductor integrated circuit device IC of this embodiment.

Here, the parity-checking circuit P-CHK can be constituted by using an exclusive OR circuit. Further, the circuit constitution shown in FIGS. 1 and 2 is employed for the hold-type slave/master latch circuit H-LATCH in order to reduce the cycle time Tc of a clock signal in the static RAM of this embodiment. That is, as shown in FIG. 1, the hold-type slave/master latch circuit H-LATCH is comprised of the latch circuit 2 that is capable of transmitting the data D input from the parity-checking circuit 44 to the data output terminals 13 and 14 in response to the clock signal, and the control circuit 1 which feeds the data output logic state of the latch circuit 2 back to the data input terminal to hold this output logic state, making it possible to increase the margin of feedback timing and to reduce the cycle time Tc of the clock signal.

Figure 6:
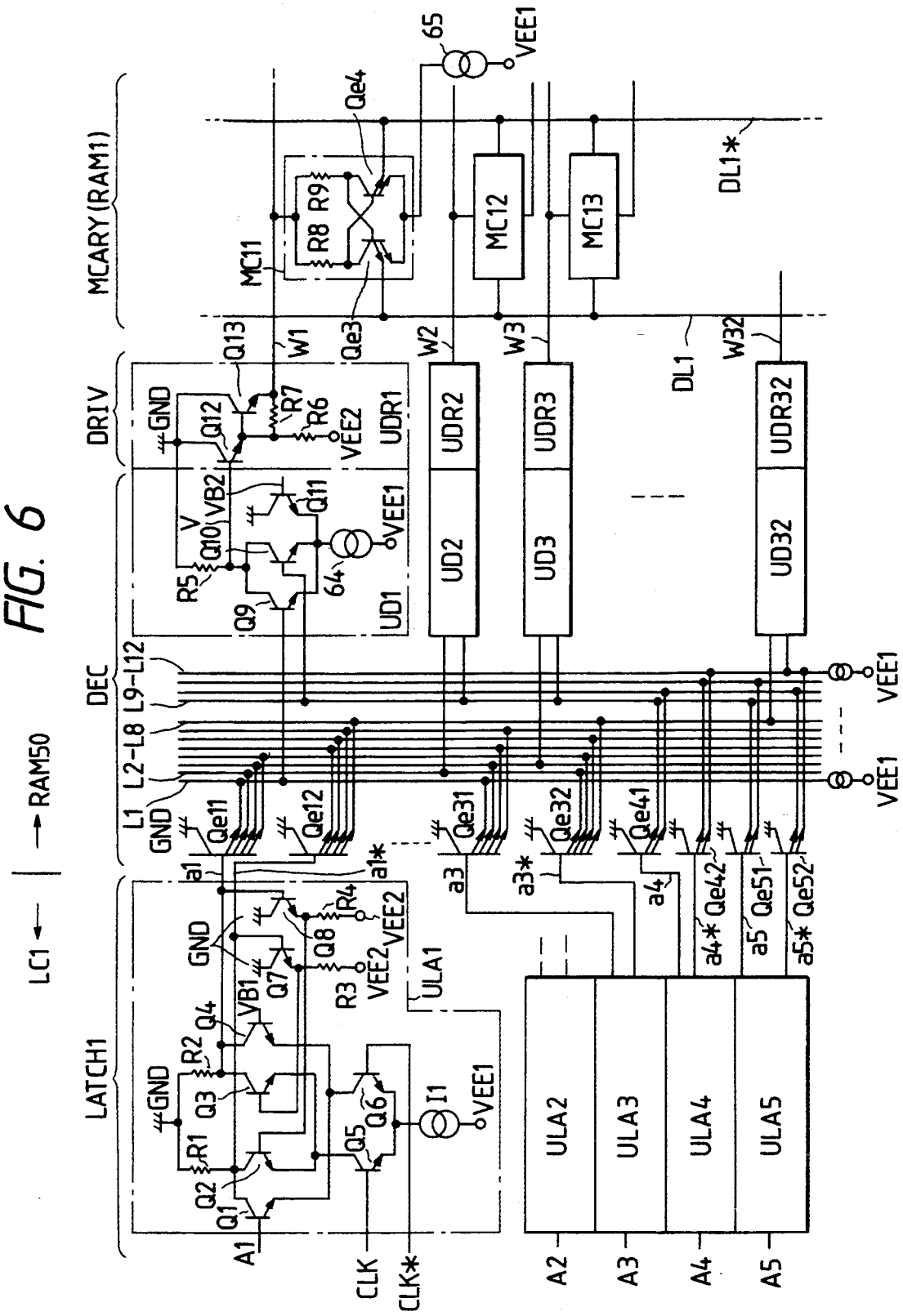
FIG. 6 is a circuit diagram illustrating the concrete constitution of a portion of a latch circuit LATCH 1 and a RAM 1 in the static RAM according to the another embodiment of the present invention.

FIG. 6 shows a concrete circuit constitution of a portion of the latch circuit LATCH1 and a portion of the RAM1 of FIG. 5.

Though there is no particular limitation, any one of the thirty-two word lines W1 to W32 arranged for the memory cell array MCARY in the RAM1 is selected based on address signals A1 to A5 that are input to the latch circuit LATCH1. The latch circuit LATCH1 includes unit latch circuits ULA1 to ULA5 that are provided for the address signals A1 to A5. The unit latch circuits ULA1 to ULA5 have the same internal structure, and the unit latch circuit ULA1 only will be described here. The emitter of a transistor Q1 that receives the address signal A1 through the base thereof is connected in common with the emitter of a transistor Q4 that receives a reference voltage VB1 through the base thereof, i.e., the transistor Q1 and the transistor Q4 constitute a pair of differential transistors. In this embodiment, the reference voltage VB1 is connected to the base of the transistor Q4. It is, however, also allowable to apply an inverted signal of the address signal A1 thereto. Similarly, pairs of differential transistors are constituted by transistor Q2 and transistor Q3, and by transistor Q5 and transistor Q6. The pair of differential transistors (Q5, Q6) selectively feed a current from a constant-current source I1 to the pair of differential transistors (Q1, Q4) or to the pair of differential transistors (Q2, Q3) depending upon complementary clock signals (CLK, CLK*). A transistor Q7 having an emitter resistance R3 and a transistor Q8 having an emitter resistance R4 are provided to connect the input and output of the pair of differential transistors (Q2, Q3) in a crossing manner relative to each other. That is, output signals a1, a1* formed between the collectors of the pair of differential transistors (Q2, Q3) and the collector resistors R1, R2 are fed back to the bases of the pair of differential transistors (Q2, Q3), thereby to constitute a latch circuit. While the pair of transistors (Q2, Q3) are in operation, the pair of transistors (Q1, Q4) are in inoperative condition, and no write operation is carried out by the address signal A1. Conversely, when the pair of differential transistors (Q2, Q3) are in inoperative condition, the pair of differential transistors (Q1, Q4) are in operative condition, and the write operation is carried out depending upon a value of the address signal A1. Though there is no particular limitation, a voltage of, for example, $-5.2$ V is employed as the power-source voltage VEE1 and a voltage of, for example, $-1.8$ V is employed as the power-source voltage VEE2.

The RAM50 directly receive complementary address signals a1, a1*, a2, a2*, ---, a5, a5* that are output from the unit latch circuits in the logic circuit LC1. Therefore, there is no need of providing address buffer circuits that form complementary address signals needed by the address decoders DEC in the RAM in a stage that precedes the address decoder DEC. Therefore, the operation speed can be at high speed.

There are provided multi-emitter transistors Qe11, Qe12, ---, Qe32 in order to selectively render only any one of the signal lines L1 to L8 to be of the low level based on the complementary address signals a1, a1*, a2, a2*, a3 a3*. That is, combinations of emitter outputs of the multi-emitter transistors Qe11, Qe12, - - -, Qe32 are accomplished by the connections of the emitters and the signal lines L1 to L8, and there exists only one combination of emitters that makes the low level. Similarly, multi-emitter transistors Qe41, - - -, Qe52 are provided to selectively render only any one of the signal lines L9 to L12 to be of the low level based on the complementary address signals a4, a4*, a5, a5*. There are 32 combinations of any one of the signal lines L1 to L8 and any one of the signal lines L9 to L12, and unit detecting circuits UD1 to UD32 are provided to detect combinations in which the two lines assume the low level. The unit detecting circuits UD1 to UD32 have internal structures which are basically the same, and the unit detecting circuit UD1 only will be described. A NAND circuit is constituted by transistors Q9, Q10 and a collector resistance R5 which is common thereto. When at least either one of the input signals to the bases of the transistors Q9 and Q10 has the high level, then a power-source current is supplied via the transistor which is turned on, the resistor R5 and a constant-current source 64. Due to a drop of voltage across the resistor R5, therefore, the output voltage V assumes the low level. When both the input signals to the bases of the transistors Q9 and Q10 have the low level, only a transistor Q11 that is impressed with a reference voltage VB2 through its base is turned on, and the power-source current flows through the transistor Q11 and the constant-current source 64, so that the output voltage v assumes the high level. The output voltage v is fed to a word line via a word line driver DRIV. The word line driver DRIV includes unit word line drivers UDR1 to UDR2 that are provided for the word lines W1 to W32. The unit word line driver UDR1 is constituted by transistors Q12 and Q13 which are Darlington-connected and by emitter resistances R6 and R7.

The memory cell array MCARY includes memory cells MC11, MC12, - - - that are provided at intersecting portions of a pair of data lines (DL1, DL1*) and the word lines W1, W2, - - - -. The memory cells have the same constitution. For instance, a memory cell MC11 includes multi-emitter transistors Qe3, Qe4 of which the bases and collectors are connected to each other in a crossing manner, and load resistors R8, R9. The memory cells are connected to a holding-current source 65 in order to hold data therein.

Figure 7:
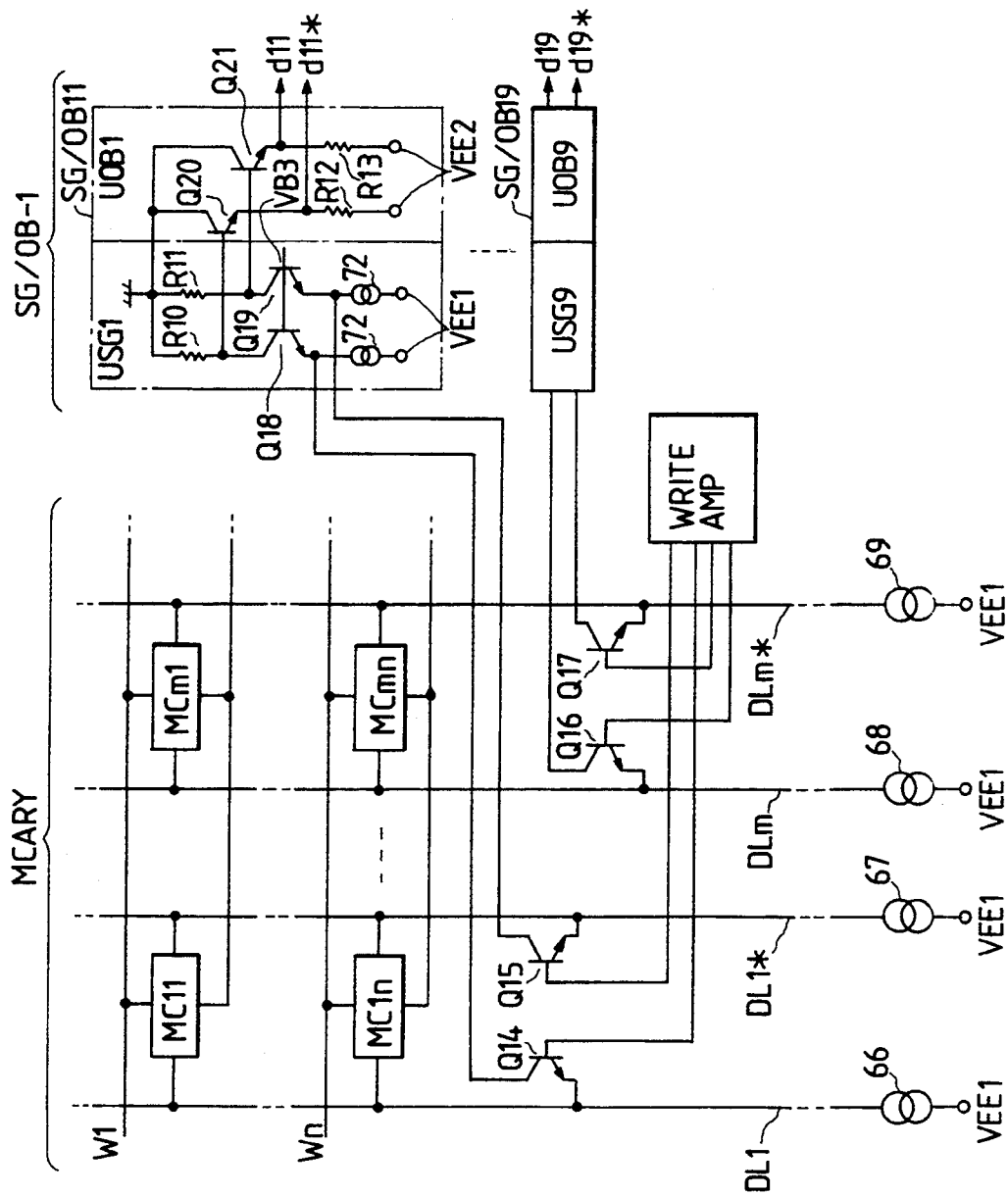
FIG. 7 is a circuit diagram showing in detail major portions of the RAM 1.

FIG. 7 shows the memory cell array MCARY, sense gate and output buffer SG/OB-1 that are provided in the RAM1. As also partly shown in FIG. 6, the memory cell array MCARY includes memory cells MC11 to MCmn that are provided at intersecting portions of the word lines W1 to Wn and pairs of data lines (DL1, DL1*)–(DLm, DLm*). The pairs of transistors (Q14, Q15), (Q16, Q17) provided for the pairs of data lines (DL1, DL1*), (DLm, DLm*) work to read data from or write data into the memory cells that correspond to the pairs of data lines. For instance, the pair of transistors (not shown) connected in a crossing manner in the memory cell MC11 have emitters that are connected in common to those of the pair of transistors Q14, Q15, the common emitters being connected to constant-current sources 66 and 67. The pair of common emitters of the pair of transistors Q16, Q17 are connected to constant-current sources 68, 69. A reference voltage and a write voltage are fed from a write amplifier (WRITEAMP) to the pairs of bases of the pairs of transistors (Q14, Q15), (Q16, Q17), and the pairs of collectors are connected to unit sense gates USG1 and USG9, respectively. The unit sense gate USG1 converts a collector current of the pair of transistors (Q14, Q15) that undergo complementary operation at the time of reading data into a complementary voltage, and sends it to a unit output buffer UOB1 of the next stage. Constant-current sources 72, 72 are provided for the emitters of the transistors Q18, Q19 that receive a common base reference voltage VB3, and collector resistors R10, R11 for forming output voltages are provided for the collectors thereof. The unit output buffer UOB1 is constituted by an impedance-converting circuit which consists of transistors Q20, Q21 and resistors R12, R13, and forms complementary output signals d11, d11*. In order to output the data of nine bits simultaneously, the RAM1 is provided with nine unit output buffers UOB1 to UOB9, and forms complementary output signals d11, d11* to d19, d19*.

According to this embodiment, the output signal of the RAM1 may be in the form of a complementary signal, and there is required no ECL unit that converts the complementary signal into a signal. This helps simplify the constitution of the unit output circuits UOB1 to UOB9, and further helps reduce the delay time in the output circuit. Moreover, the complementary output signals d11, d11* to d19, d19* are fed to a logic circuit in the same chip as the RAM1, and are less affected by the load capacitance and noise than the case of when they are fed to a unit outside the chip. Therefore, a large driving ability is not needed, and the amplitudes of signals can be small, making it possible to reduce the consumption of electric power. According to this embodiment, the output buffer is driven on a relatively small power source voltage VEE2.

Figure 8:
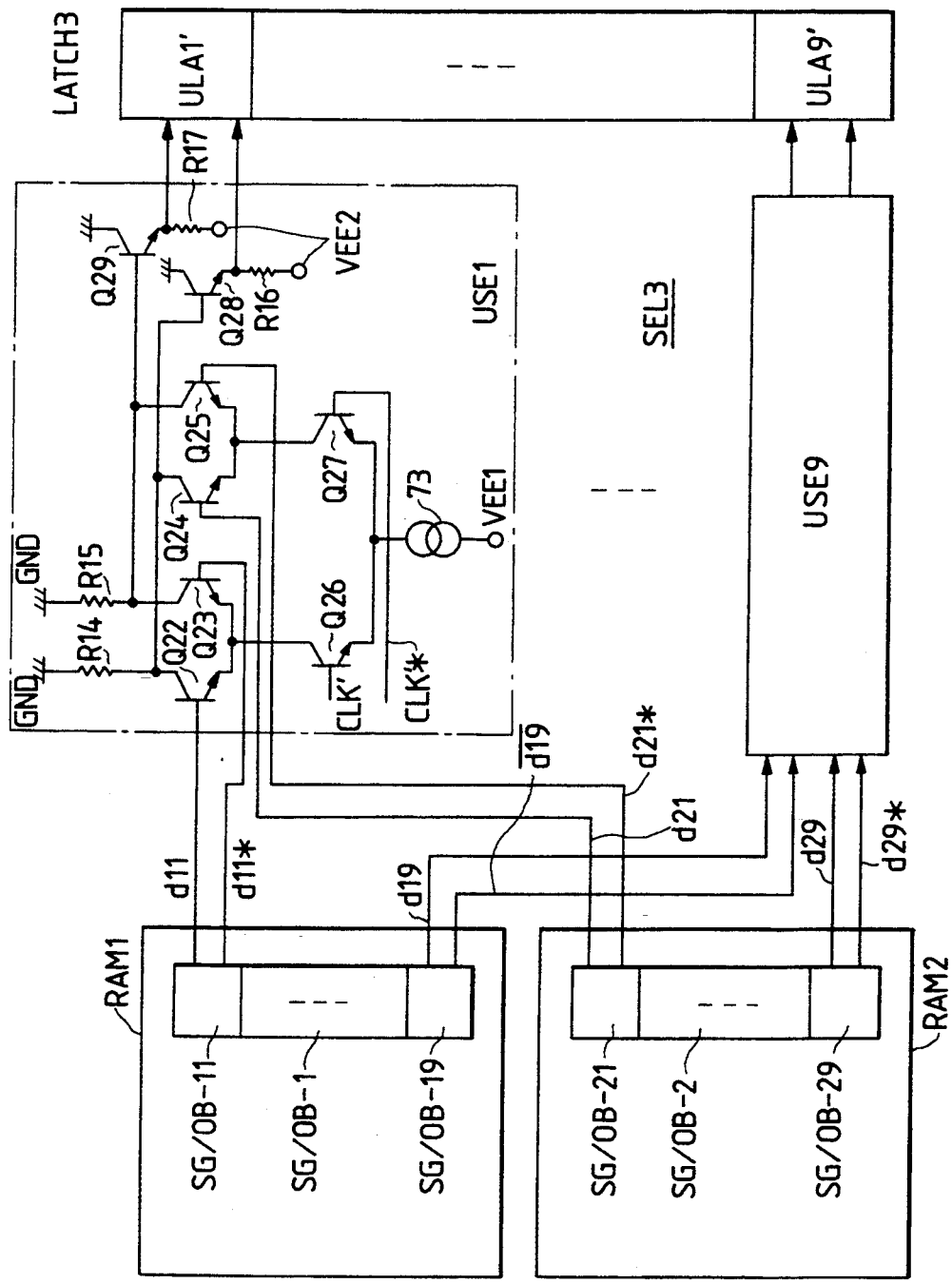
FIG. 8 is a circuit diagram showing a relationship of connection between the RAM shown in FIG. 5 and a selection circuit SEL 3.

FIG. 8 illustrates a relationship of connection between the RAM50 and the selection circuit SEL3 that are shown in FIG. 5. The selection circuit SEL3 is provided in order to select the output signal line of either the sense gate and output buffer SG/OB1 in the RAM1 or the sense gate and output buffer SG/OB2 in the RAM2, and to send signals on the output signal line to the output latch circuit LATCH3. There are provided nine unit selection circuits USE1 to USE9 that correspond to complementary output signals d11, d11* to d19, d19* of the sense gates and output buffers SG/OB-11 to SG/OB-19 and that further correspond to complementary output signals d21, d21* to d29, d29* of the sense gates and output buffers SG/OB-21 to SG/OB-29. As represented by a unit selection circuit USE1, each unit selection circuit has two pairs of differential transistors (Q22, Q23) and (Q24, Q25) that receive two complementary signals d11, d11* and d21, d21*. A current of a constant-current source 73 is selectively fed via the pair of differential transistors (Q26, Q27) in order to selectively operate either one of the above two pairs of differential transistors. For instance, when a base signal CLK' of the transistor Q26 has the high level, the pair of differential transistors (Q22, Q23) are placed under the operative condition, and complementary signals corresponding to the complementary output signals d11, d11* appear at the ends of common collector resistors R14 and R15. Conversely, when the base signal CLK' of the transistor Q27 has the high level, the pair of differential transistors (Q24, Q25) are placed under the operative condition, and complementary signals corresponding to the complementary output signals d21, d21* appear at the ends of the common collector resistors R14 and R15. Thus, the selection operation is controlled by the signals CLK', CLK'*. An impedance-converting means consisting of, for example, transistors Q28, Q29 and emitter resistors R16, R17 is provided at the output portion of each of the unit selection circuits USE1 to USE9, and output complementary signals thereof are sent to each of the unit output latch circuits ULA1' to ULA9'.

As described above, this embodiment includes the RAM1 and the RAM2 having the same constitution, whereby the write operation is carried out for one RAM in parallel with the read operation for the other RAM. Due to this function, therefore, the data must be read out and written at high speeds. Moreover, the circuit shown in FIGS. 1 and 2 is used as the hold-type slave/master latch circuit H-LATCH for latching the output of the parity-checking circuit P-CHK, making it possible to double the margin of feedback timing like in the case of the aforementioned embodiment. This makes it possible to easily reduce the cycle time Tc of the clock signal CLK* correspondingly. Owing to the margin in the feedback timing, therefore, no limitation is imposed on the operation speed of the static RAM which is very effective for increasing the operation speed of the semiconductor integrated circuit device that includes the static RAM.

In the foregoing was concretely described the invention accomplished by the present inventors by way of embodiments. It should, however, be noted that the invention is in no way limited thereto only but can be modified in a variety of ways without departing from the gist and scope of the invention.

In the above embodiments, for instance, the feedback signal is obtained from the non-inversion output terminal 13 of the hold-type slave/master latch circuit 11. It is, however, also possible to obtain a feedback signal from the inversion output terminal 14. That is, when the OR gate 15 is adapted as in the aforementioned embodiments, the same functions and effects as those of the above embodiments can be obtained even by inverting the output Q* of the inversion output terminal 14 by an inverter and inputting it to the OR gate 15.

The foregoing description has chiefly dealt with the case where the invention accomplished by the present inventors was applied to a semiconductor integrated circuit device that includes the static RAM in a field of art that served as the background of the invention. The invention, however, is in no way limited thereto only but can be widely adapted to a variety of semiconductor memory devices such as pseudo-static RAMs and dynamic RAMs as well as a variety Of semiconductor integrated circuits such as microcomputers and the like. Although FIG. 2 illustrated an example in which the circuit of FIG. 1 was constituted by using bipolar transistors, the circuit of FIG. 1 may be constituted by using p-channel and n-channel MOSFETs (metal oxide semiconductor field-effect transistors). In this case, the memory of FIG. 3 or the semiconductor integrated circuit device of FIG. 5 is constituted by using p-channel and n-channel MOSFETs or p-channel and n-channel MOSFETs and bipolar transistors.

The present invention is applied under the condition where there is included at least a latch circuit that latches the input data.

Briefly described below are the effects that are obtained by representative examples of the invention disclosed in this application.

That is, the data output logic state is fed from the data output terminal back to the data input terminal through a feedback circuit, and the setup time ts and the holding time th are determined from the falling edge of the clock signal, enabling the margin of feedback timing to be increased. By applying the hold-type latch circuit having an increased margin in the feedback timing to the semiconductor memory device, furthermore, it is made possible to increase the operation speed of the semiconductor memory device.

What is claimed is:

1. A hold-type circuit which holds a result of a parity check outputted from a parity-checking circuit and which provides an output indicative of the parity check result, comprising:
   a latch circuit which holds the result of the parity check in response to clock signals; and
   a control circuit which is coupled to said latch circuit and which controls the holding of the result of the parity check in said latch circuit, wherein the result of the parity check held in said latch circuit remains unchanged if the output of said latch circuit indicates to said control circuit that the held result of the parity check represents an error in the parity check.

2. A hold-type latch circuit according to claim 1, wherein said control circuit includes an OR gate that produces a logical sum of the result of the parity check inputted from an external unit and the result of the parity check held in said latch circuit, and wherein the logical sum outputted from said OR gate is inputted to said latch circuit.

3. A hold-type latch circuit according to claim 2, wherein said control circuit further includes a delay circuit that transmits the result of the parity check of said latch circuit to said OR gate after a predetermined delay time.

4. A hold-type latch circuit according to claim 3, wherein said latch circuit is comprised of a slave circuit as a first stage thereof and a master circuit as a second stage thereof, the first and second stages of said latch circuit are each comprised of emitter-coupled logic (ECL) circuit arrangements, wherein said delay circuit is comprised of cascade-connected logic inverters, and wherein said OR gate is comprised of an ECL type circuit.

5. A hold-type latch circuit according to claim 4, wherein said latch circuit holds the result of the parity check in response to a falling edge of said clock signals, said clock signals being a series of continuous, bi-level pulses applied at a clock input terminal of said latch circuit.

6. A semiconductor device according to claim 5, wherein said latch circuit further includes a reset input terminal.

7. A semiconductor device comprising:
   a plurality of memory cells;
   means for checking data read out from said plurality of memory cells; and
   means for holding an output data of the checking means, said means for holding including:
      a data input terminal,
      a data output terminal,
      a latch circuit which receives via said data input terminal the output data from the checking means, which holds the output data received in response to clock signals, and which outputs the held output data to said data output terminal, and
      a control circuit which is adapted to maintain at a fixed level a logic state of the held output data outputted from said latch circuit, wherein said control circuit includes a feedback circuit that feeds the logic state of said data output terminal back to said data input terminal.

8. A semiconductor device according to claim 7, wherein said memory cells include static memory cells.

9. A semiconductor device according to claim 7, wherein said feedback circuit includes an OR gate that produces a logical sum of the output data from said data input terminal and the held output data of said latch circuit, and wherein the logical sum outputted from said OR gate is inputted to said latch circuit.

10. A semiconductor device according to claim 9, wherein said feedback circuit includes a delay circuit that transmits the held output data of said latch circuit to said OR gate after a predetermined delay time.

11. A semiconductor device according to claim 10, wherein said memory cells include static memory cells.

12. A semiconductor device according to claim 10, wherein said latch circuit is comprised of a slave circuit as a first stage thereof and a master circuit as a second stage thereof, the first and second stages of said latch circuit are each comprised of emitter-coupled logic (ECL) circuit arrangements, wherein said delay circuit is comprised of cascade-connected logic inverters, and wherein said OR gate is comprised of an ECL type circuit.

13. A semiconductor device according to claim 10, wherein said latch circuit holds the output data from the checking means in response to a falling edge of said clock signals, said clock signals being a series of continuous bi-level pulses applied at a clock input terminal of said latch circuit.

14. A semiconductor device according to claim 13, wherein said latch circuit is comprised of a slave circuit as a first stage thereof and a master circuit as a second stage thereof, the first and second stages of said latch circuit are each comprised of emitter-coupled logic (ECL) circuit arrangements, wherein said delay circuit is comprised of cascade-connected logic inverters, and wherein said OR gate is comprised of an ECL type circuit.

15. A semiconductor device according to claim 14, wherein said memory cells include static memory cells.

16. A semiconductor device according to claim 15, wherein said latch circuit further includes a reset input terminal.

17. A semiconductor device according to claim 16, wherein said means for checking includes a parity-checking circuit, and wherein said control circuit sets the logic state outputted from said latch circuit at said fixed level when the held output data outputted from said latch circuit corresponds to a parity check error and maintains said fixed level even if subsequent parity checking results during the data read out from said memory cells indicates no-error in the parity check.

18. A semiconductor device according to claim 17, wherein said device is provided on a single semiconductor chip.

19. A semiconductor device according to claim 13, wherein said latch circuit further includes a reset input terminal.

20. A semiconductor device according to claim 7, wherein said device is provided on a single semiconductor chip.

* * * * *